United States Patent [19]

Unterweger et al.

[11] Patent Number: 5,150,271
[45] Date of Patent: Sep. 22, 1992

[54] TELECOMMUNICATION EQUIPMENT PROTECTOR

[75] Inventors: Diethard Unterweger, Plainville; Pravin N. Popat, Norton; Ronald J. Candelet, Attleboro, all of Mass.

[73] Assignee: Texas Instruments Incorporated, Dallas, Tex.

[21] Appl. No.: 570,579

[22] Filed: Aug. 21, 1990

[51] Int. Cl.⁵ .............................................. H02H 9/00
[52] U.S. Cl. ...................................... 361/119; 361/91; 361/56
[58] Field of Search .................. 361/119, 91, 56, 111; 357/38

[56] References Cited
U.S. PATENT DOCUMENTS

| | | | |
|---|---|---|---|
| 3,708,720 | 1/1973 | Whitney et al. | 361/91 |
| 4,695,916 | 9/1987 | Satoh et al. | 361/91 |
| 5,001,537 | 3/1991 | Colman et al. | 357/38 |

OTHER PUBLICATIONS

Telecommunications Protection Circuits — Protection Design Guide — Copyright 1987 by Texas Instruments.

Primary Examiner—A. D. Pellinen
Assistant Examiner—S. Jackson
Attorney, Agent, or Firm—Russell E. Baumann; Richard L. Donaldson; René E. Grossman

[57] ABSTRACT

A simplified solid state transient voltage and overcurrent protector for telecommunications equipment providing uniform protection characteristics between telephone lines and between either line and ground is shown in which two symmetrical thyristor chips are mounted with their normal common layer connected together on an enlarged heat sink. The assembly, together with current limiting PTC elements is encapsulated to form a dual-in-line package.

10 Claims, 3 Drawing Sheets

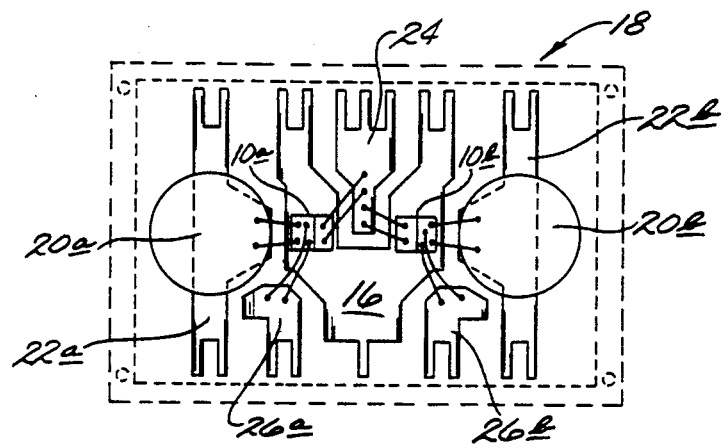
Fig. 6.
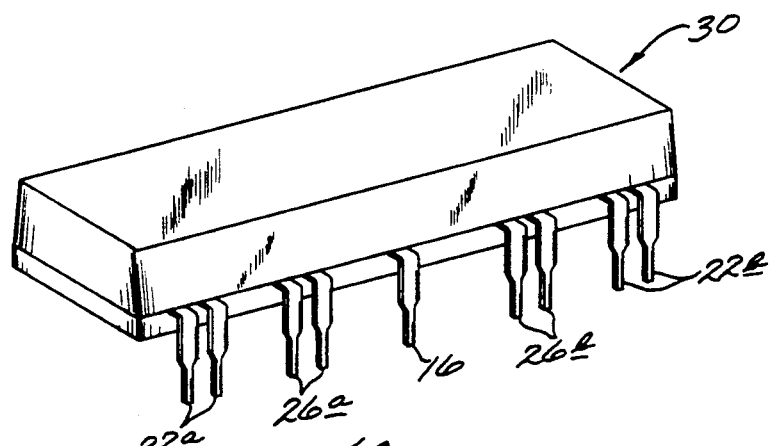
Fig. 7.
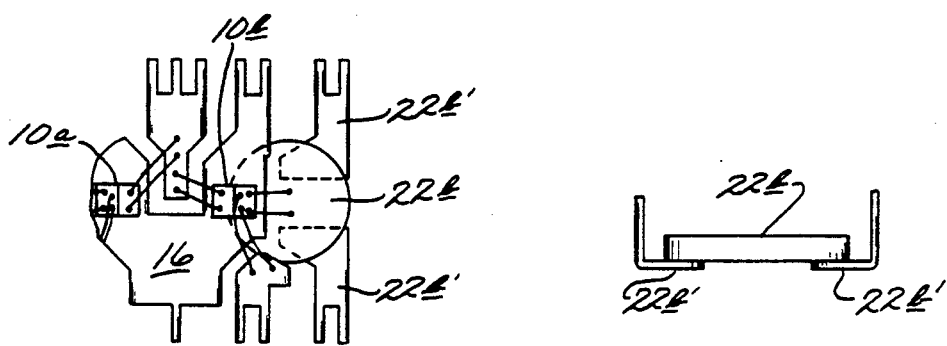
Fig. 8.
Fig. 9.

TELECOMMUNICATION EQUIPMENT PROTECTOR

BACKGROUND AND SUMMARY OF THE INVENTION

The present invention relates generally to protective devices for telecommunication equipment and more particularly to secondary protectors for high voltage and current transients that may occur on the telephone tip or ring lines.

High voltage transients may occur due to lightning strikes, power line switching or the like and can cause deleterious affects on modern telecommunication equipment including facsimile machines, modems and the like. Zener diodes, gas discharge tubes and MOV's are among the conventional devices which have been used to protect equipment such as relays and transformers from such disturbances; however, none of these are satisfactory for use with sensitive electronic equipment currently in use. Zener diodes, for example, are not suitable for transient suppression since they are designed for DC dissipation having relatively low thermal capacitance and are not designed to handle high pulsed energy. MOV's (metal-oxide varistors) do not have a sharp current initiation and thus their usefulness is limited by the amount of leakage current which can be tolerated. MOV's also degrade as a result of operation which ultimately leads to a loss of protection. Gas discharge tubes do not react quickly enough to provide effective protection to fast rising voltage wave forms.

Recently a new series of surge protectors has become available which provides improved solid state telephone line protection. Known as the TISP series of dual symmetrical transient voltage suppressors, manufactured and sold by Texas Instruments Incorporated, they comprise two bidirectional suppressor elements connected to a common terminal. They will suppress voltage transients between the ring terminal and common, the tip terminal and common and between the ring and tip terminals. The TISP protector is based on a four layer thyristor structure whose gate region contains a diffused section that acts as a zener. At low current levels the TISP protector limits the overvoltage similar to a zener diode. Higher current levels result in a crowbar action by the thyristor portion shunting excess energy away from the equipment. The device gives bidirectional protection for any wire to ground and wire to wire.

The device comprises a chip as shown in FIGS. 1 and 2 having four protector sections, two for positive voltage (A+, B+) and two for negative voltage (A−, B−) protection. All four sections have a common connection C at the bottom of the chip which normally is connected to ground.

Having a symmetrical construction the zener voltage, $V_z$, between A and C and B and C is the same. However, the protection voltage level from A to B is two times $V_z$.

In applications where the same energy capability is required for all combinations separate devices are required as indicated in FIG. 3; however, this arrangement is undesirable since it results in unbalanced turn-on. Further, it is desirable that the protector be provided in a single package but for the FIG. 3 arrangement this would be difficult to achieve since there is no electrically common mounting surface, that is, the heat sinks of the chips are electrically isolated. The resulting lead frame would be considerably complex as well as having limited heat sink area available for each chip.

It is therefore an object of the present invention to provide a transient voltage protector for telecommunication equipment having the same protection capabilities between the two telephone lines and between each line and ground with balanced turn-on and which is readily manufacturable and small in size.

It is another object to provide a transient voltage protector which also has current limiting capability. Conventionally, when current limiting is desired a fuse element or PTC (positive temperature coefficient of resistivity) element is separately placed in series with the equipment to be protected and the transient voltage protector.

Briefly, in accordance with a first embodiment of the invention, first and second solid state chips, each having four laterally disposed protector sections, two for positive voltage protection and two for negative voltage protection and having a bottom portion connected to all four sections is thermally and electrically coupled to a common heat sink. The A section of one is coupled to one telephone line and the B section of the other is coupled to the other telephone line with the other of the A and B sections electrically coupled together. This results in two protector sections being effective for any of the three transient possibilities, i.e., either telephone line to ground or one telephone line to the other, providing balanced turn-on.

In another embodiment the common heat sink is a portion of a dual-in-line lead frame and two electrically isolated portions are electrically connected respectively to first and second PTC elements which are in turn electrically and thermally connected to the chips. Both the chips and the PTC elements are bonded to the lead frame using electrically and thermally conductive materials and the top portion of the PTC elements and the chips are electrically connected through wire connections. The entire assembly is encapsulated in thermally conductive and electrically insulative low stress overmold material.

BRIEF DESCRIPTION OF THE DRAWINGS

The present invention will be described with reference to the accompanying drawing wherein:

FIG. 6 is a top plan view of a dual-in-line lead frame with two chips mounted on a common heat sink as in FIG. 5 along with two PTC elements mounted on separated portions of the lead frame;

FIG. 7 is a perspective view of a transient voltage protector package having overcurrent protection capability made from the FIG. 6 assembly; and FIG. 8 is a broken away top plan view of a modified dual-in-line lead frame.

DESCRIPTION OF THE PREFERRED EMBODIMENTS

Figure 1:
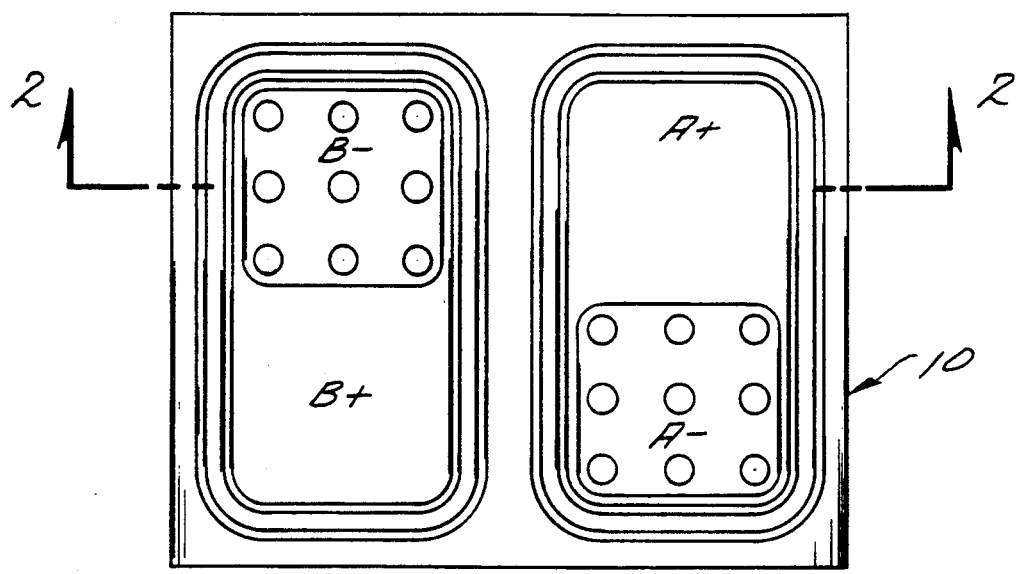
FIG. 1 is a top plan view of a TISP semiconductor chip which may be used in the invention.
Figure 2:
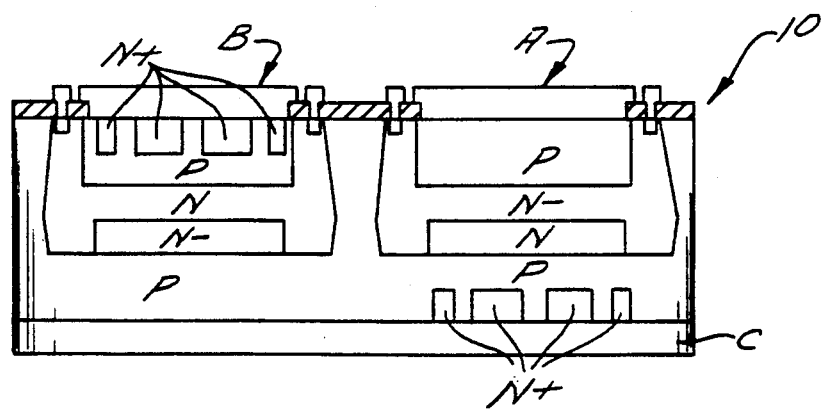
FIG. 2 is a cross sectional view taken on line 2—2 of FIG. 1 with oxide and metallization added.

In FIGS. 1 and 2 is shown a simplified TISP chip structure 10 such as the TISP3180 manufactured and sold by Texas Instruments Incorporated. The TISP3180 is designed specifically for telephone equipment protection against lightning and transients induced by AC power lines and gives bidirectional overvoltage line protection for all conditions, that is, any wire to ground and wire to wire. Chip 10 has four protector sections, A+, A−, B+ and B−, two for positive (A+, B+) and two for negative (A−, B−) overvoltage protection. All four sections have a common connection C at the bottom of the chip which is normally connected to the system ground. Each line wire is connected to a positive and a negative voltage limiting section. Positive voltage protection is given by the pn−npn+ section (A shown in FIG. 2) and negative voltage protection is given by the n+pnn−p section (B shown in FIG. 2).

Having a symmetrical construction, the zener voltage, $V_z$, between A and C and B and C is the same. However, the voltage protection level from A to B is two times V, For applications where the same energy capability is required for all combinations a separate chip 10 is placed across the line as shown in FIG. 3.

Figure 3:
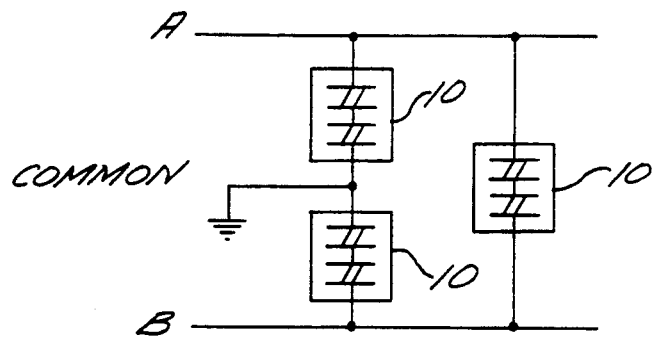
FIG. 3 is a schematic circuit showing prior art protection for telecommunication equipment in which the same protection capability is provided for all voltage transient possibilities.
Figure 4:
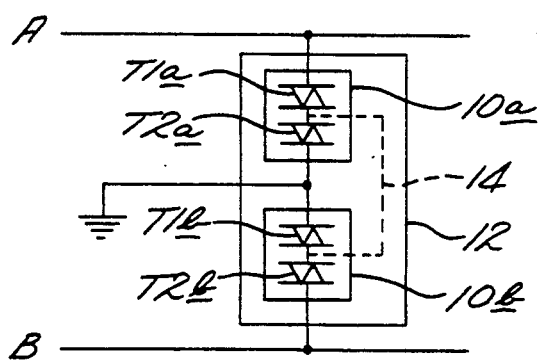
FIG. 4 is a schematic circuit showing a first embodiment of the invention.
Figure 5:
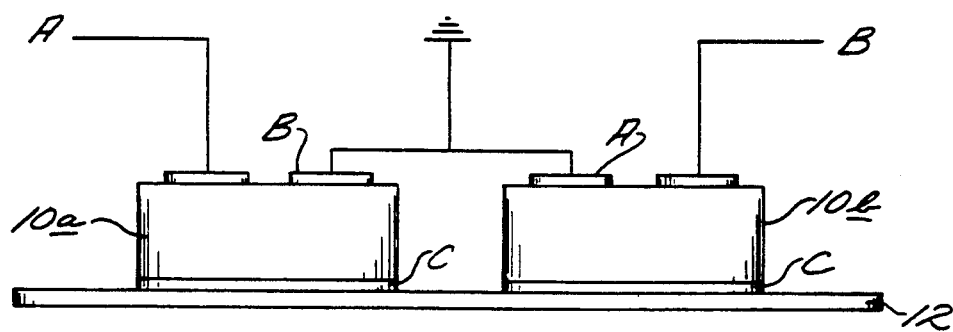
FIG. 5 is a side view of two chips of the type shown in FIGS. 1 and 2 mounted on a common heat sink in accordance with the invention.

In accordance with the invention FIGS. 4 and 5 show first and second TISP chips 10a and 10b mounted on a large, common heat sink 12 which performs the same protective function as the FIG. 3 structure but also provides balanced turn-on and simplifies the assembly and increases the available heat sink space.

By way of explanation, assume the zener voltage is 290 V for chip 10a (A to ground). This means each thyristor section T1a and T2a has a zener voltage of 145 V. Since both chips are identical the zener voltage from B to ground will also be 290 V. Should a transient occur between A and B thyristor T1a will conduct through the back of the chip, the common heat sink 12 (see dash line 14 for a schematic showing of the current path) and through thyristor T2b of chip 10b. Since chip is effectively used a zener voltage of 290 V will therefore result between A and B. Should a transient occur between A and ground chip 10A turns on, the zener voltage from B to ground is reduced from 290 V to 145 V producing a "balanced" breakdown. Current flow from B to ground occurs from B through T2b, through dashed line through T2a.

With reference to FIG. 6 first and second TISP chips 10a, 10b are mounted on a portion 16 of lead frame 18 bonding the chips to portion 16 with a suitable electrically and thermally conductive epoxy such as a silver filled epoxy or solder alloys. First and second PTC elements 20a, 20b are mounted respectively on separated portions 22a, 22b and bonded thereto using similar electrically and thermally conductive silver filled epoxy or solder alloys. PTC elements 20a, 20b may be any conventional positive temperature coefficient of resistivity material such as wafers of lanthanum or other rare earth doped barium titanate and have conductive coatings on opposite faces thereof. Using suitable wire bonding techniques such as ultrasonic wedge bonding, aluminum wire is bonded to the top face of PTC element 20a and to one of the A and B sections of chip 10a (both positive and negative portions) and the top face of PTC element 20b is bonded to the other of the A and B sections of chip 10b (both positive and negative portions) and from these sections wires are bonded and connected to lead frame portion 26a. The remaining sections of chips 10a, 10b are connected together via wire bonds to lead frame portion 24. One or more wires can be used for the interconnections depending on the current rating of the device.

It will be noted that lead frame portion 16, although having pins, is not intended to be electrically connected to any external circuit. The pins are used to enhance support of the protector on the circuit board. Although it is possible in some applications to thermally couple the heat sink portion 16 to a circuit board if it is desired to dissipate heat therefrom normally this would not be done since that would render the protective function of the PTC elements for the chips less sensitive.

By placing the PTC elements in the same package thermally coupled to the chip, current limiting is achieved not only by excess currents through the telephone lines but also when the silicon chip overheats due to excessive transient activity. This results in the dual function of protecting the telephone line from overcurrents and the silicon chips from overtemperature.

The entire assembly is then encapsulated with highly thermally conductive material such as epoxy. If desired, both silicon chips and PTC elements can be coated with RTV to reduce thermal stresses. The outer portions of the lead frame 18 is then severed and the pins bent downwardly to provide a dual-in-line package 30 as shown in FIG. 7 in which the PTC elements are thermally coupled to the TISP chips and serve to limit current. If the TISP chips, due to a fault condition overheat, the PTC due to thermal coupling will heat and limit the current through the chips to acceptable levels.

Normally current goes into terminal 22a, through PTC pill 20a to chip 10a and then, since it is below threshold of the chips to terminal 26a which is connectable to the telephone equipment to be protected. If there is a transient the chip will conduct through one section, heat sink and out other section to terminal 24 (ground). Note if there is a chip failure the telephone will be disconnected indicating to the telephone equipment user that the protector needs to be replaced.

Thus by means of the invention a protective device is provided which uses two chips with the same electrical and physical characteristics on a common heat sink to provide equal and balanced transient voltage protection between both telephone wires and either wire and ground in a low cost simplified package. Inventory requirements are reduced due to the use of identical chips and the possibility of mix-up of unlike chips during assembly is avoided . Further enhanced performance characteristics are achieved for current limiting caused by line cross as well as chip overheating by thermally coupling PTC elements in a controlled manner within the package.

FIG. 8 shows a modification of the FIG. 6 lead frame which provides a more compact protector. Lead frame portions 22a' and 22b' (only portion 22b' being shown) are each severed intermediate their pin ends and bent downwardly a selected distance and bent again so that the distal end portion lie in a plane parallel to lead frame portion but beneath it. The PTC element 20b can then be shifted toward the heat sink portion 16 having a portion directly underneath thereby reducing longitudinal space as well as enhancing the thermal coupling between PTC element 20b and chip 10b.

It is within the preview of the invention to employ electronic packages other than DIP, such as SIP, SMT and various special configurations.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A high voltage transient protector for telecommunication equipment coupled to a ring line, tip-line and common line comprising first and second solid state chips, each chip having four laterally disposed protector sections, two for positive voltage protection and two for negative voltage protection, the chips having a bottom portion electrically connected to all four sections, a dual-in-line lead frame, a first portion of the lead frame forming a heat sink member, the bottom portion of the first and second chips mounted on and electrically bonded to the first portion of the lead frame, first and second current carrying positive temperature coefficient of resistivity elements electrically bonded to other electrically separated portions of the lead frame and to the first and second protection sections respectively, and plastic encapsulant encasing the chips, resistance elements and lead frame with a plurality of leads extending from the lead frame out of the encapsulant.

2. A protector according to claim 1 in which the protector sections are four layer thyristors.

3. A high voltage transient protector for telecommunication equipment coupled to a ring line, tip line and common line comprising at least one solid state four layer thyristor chip having a bottom portion, a dual-in-line lead frame, a first portion of the lead frame forming a heat sink member, the bottom portion of the at least one chip mounted on and electrically bonded to the first portion of the lead frame, at least one current carrying positive temperature coefficient of resistance element electrically bonded to an electrically separated portion of the lead frame and serially electrically bonded to the chip and plastic encapsulant encasing the chip, resistance element and lead frame with a plurality of leads extending from the lead frame out of the encapsulant.

4. A protector according to claim 3 in which electrical connections between the top portions of the chip and resistance elements with one another and with the frame comprise Al wire.

5. A high voltage transient protector for telecommunication equipment coupled to a ring line, tip line and common line comprising at least one solid state four layer thyristor chip having a bottom portion, a dual-in-line lead frame, a first portion of the lead frame forming a heat sink member, the bottom portion of the at least one chip mounted on and electrically connected to the first portion of the lead frame, at least one positive temperature coefficient of resistance element electrically coupled to an electrically separated portion of the lead frame and serially coupled to the chip, said chip and resistance element are bonded to the lead with electrically conductive epoxy and plastic encapsulant encasing the chip, resistance element and lead frame with a plurality of leads extending from the lead frame out of the encapsulant.

6. A protector according to claim 5 in which the epoxy is filled with silver.

7. A high voltage transient protector for telecommunication equipment coupled to a ring line, tip line and common line comprising at least one solid state four layer thyristor chip having a bottom portion, a dual-in-line lead frame, a first portion of the lead frame lying in a first plane and forming a heat sink member, the bottom portion of the at least one chip mounted on and electrically bonded to the first portion of the lead frame, at least one current carrying positive temperature coefficient of resistance element electrically bonded to an electrically separated portion of the lead frame and serially electrically bonded to the chip, the separated portion of the lead frame having a portion lying in a second plate disposed below and parallel with the first plane, the element mounted on the portion lying in the second plane and plastic encapsulant encasing the chip, resistance element and lead frame with a plurality of leads extending from the lead frame out of the encapsulant.

8. A high voltage transient protector for telecommunication equipment coupled to a ring line, tip line and common line comprising at least one solid state four layer thyristor chip having a bottom portion, a dual-in-line lead frame, a first portion of the lead frame lying in a first plane and forming a heat sink member, the bottom portion of the at least one chip mounted on and electrically connected to the first portion of the lead frame, at least one positive temperature coefficient of resistance element electrically coupled to an electrically separated portion of the lead frame and serially coupled to the chip, the separated portion of the lead frame having a portion lying in a second plane, the chip and resistance element are bonded to the lead frame with electrically conductive epoxy and plastic encapsulant encasing the chip, resistance element and lead frame with plurality of leads extending from the lead frame out of the encapsulant.

9. A protector according to claim 8 in which the epoxy is filled with silver.

10. A high voltage transient protector for telecommunication equipment coupled to a ring line, tip line and common line comprising at least one solid state chip to limit voltage to a selected level, the chip having a bottom portion, a lead frame, a first portion of the lead frame forming a heat sink member, the bottom portion of the at least one chip mounted on and electrically bonded to the first portion of the lead frame, at least one current carrying positive temperature coefficient of resistance element electrically bonded to an electrically separated portion of the lead frame and serially electrically bonded to the chip and thermally coupled to the chip and plastic encapsulant encasing the chip, resistance element and lead frame with a plurality of leads extending form the lead frame out of the encapsulant whereby the resistance element will limit current to the chip as well as the telecommunication equipment.

* * * * *